United States Patent
Courcy (10) Patent No.: US 7,126,396 B1
(45) Date of Patent: Oct. 24, 2006

(54) SYSTEM FOR CLOCK DUTY CYCLE STABILIZATION

(75) Inventor: Matthew Louis Courcy, Fremont, NH (US)

(73) Assignee: National Semiconductor Corporation, Santa Clara, CA (US)

( * ) Notice: Subject to any disclaimer, the term of this patent is extended or adjusted under 35 U.S.C. 154(b) by 10 days.

(21) Appl. No.: 10/622,150

(22) Filed: Jul. 16, 2003

(51) Int. Cl.
H03K 5/1534 (2006.01)
H03M 1/00 (2006.01)

(52) U.S. Cl. ............... 327/175; 327/166; 341/122
(58) Field of Classification Search ......... 341/122, 341/155; 327/165, 166, 170, 175
See application file for complete search history.

(56) References Cited

U.S. PATENT DOCUMENTS

| | | | | |
|---|---|---|---|---|
| 5,394,114 A | * | 2/1995 | Davis | 327/175 |
| 5,892,286 A | * | 4/1999 | Toyoda et al. | 257/775 |
| 6,320,437 B1 | * | 11/2001 | Ma | 327/175 |
| 6,323,706 B1 | * | 11/2001 | Stark et al. | 327/175 |
| 2002/0075730 A1 | * | 6/2002 | Zheng et al. | 365/191 |
| 2003/0107432 A1 | * | 6/2003 | Huynh | 330/9 |
| 2004/0203479 A1 | * | 10/2004 | Lin | 455/73 |

FOREIGN PATENT DOCUMENTS

EP  570158 A2 * 11/1993

* cited by examiner

Primary Examiner—Howard L. Williams (57) ABSTRACT

A clock signal duty cycle stabilization system. The system includes a clock signal duty cycle stabilization circuit having an edge detection circuit and a latch circuit. The edge detection circuit is configured to receive an external clock signal and generate an output therefrom. The latch circuit is coupled to receive the output from the edge detection circuit. The latch circuit is configured to produce a rising edge of an internal clock signal and a falling edge of the internal clock signal in accordance with the output of the edge detection circuit.

19 Claims, 6 Drawing Sheets

SYSTEM FOR CLOCK DUTY CYCLE STABILIZATION

TECHNICAL FIELD

The present invention relates to the field of mixed signal integrated circuit devices. More particularly, the present invention relates to the provision of high-quality clock signals for analog-to-digital converter integrated circuit devices.

BACKGROUND ART

Modern Analog to Digital Converters (ADCs) are timed based on a user supplied low jitter external clock source. These ADCs often operate on both phases of this clock signal to increase both efficiency and throughput. ADCs are specified to operate with a clock signal having a duty cycle that varies across a certain range. As is well known, a clock signal's duty cycle refers to a ratio of one clock phase width to the entire clock period. An ADC capable of operating over a wider duty cycle range can be beneficial in that the ADC is more flexible and useful across a larger set of applications.

A problem exists with prior art ADCs having the capability of operating over a wider clock signal duty cycle. Such prior art ADCs have internal circuitry configured to function with wide-ranging duty cycles. This circuitry unfortunately also increases the power needed to achieve high performance. Excessive power requirements leads to a number of disadvantages. For example, in handheld applications, an excessive power requirement reduces the battery life of a device. In other applications, excessive power requirements can lead to heat dissipation problems, noise problems, and other types of unreliability effects.

Thus, what is required is a solution for implementing duty cycle stabilization for an ADC integrated circuit device. The required solution should be capable of producing a clock signal having a duty cycle that is independent of any external clock duty cycle. Additionally, the required solution should be capable of producing a clock signal having a near optimal duty cycle of 50% for lowest power consumption in most ADCs. The present invention provides a novel solution to these requirements.

SUMMARY OF THE INVENTION

Embodiments of the present invention provide a solution for implementing duty cycle stabilization for an ADC integrated circuit device. Embodiments of the present invention are capable of producing a clock signal having a duty cycle that is independent of any external clock duty cycle. Additionally, embodiments of the present invention are capable of producing a clock signal having a near optimal duty cycle of 50% for lowest power consumption in most ADCS.

In one embodiment, the present invention is implemented as a clock signal duty cycle stabilization circuit for producing a high-quality internal clock signal. The circuit includes an edge detection circuit and a latch circuit. The edge detection circuit is configured to receive an external clock signal (e.g., a reference clock signal produced by an external VCO, a crystal oscillator, a high quality sine source, etc.) and generate an output therefrom. The latch circuit is coupled to receive the output from the edge detection circuit. The latch circuit is configured to produce a rising edge of the internal clock signal and a falling edge of the internal clock signal in accordance with the output of the edge detection circuit. The duty cycle of the internal clock signal is very stable and is substantially independent of duty cycle variations of the external clock signal.

In one embodiment, the edge detection circuit comprises a NAND gate coupled to a delay element, wherein the NAND gate has an input to receive the external clock signal and an output for producing the output of the edge detection circuit. In one embodiment, the latch circuit comprises an R-S latch, wherein the R-S latch is configured to receive the output of the edge detection circuit and generate the rising edge and the falling edge therefrom. Additionally, in one embodiment, the internal clock signal is a 50% duty cycle clock signal for use by an ADC.

BRIEF DESCRIPTION OF THE DRAWINGS

The present invention is illustrated by way of example and not by way of limitation, in the Figures of the accompanying drawings and in which like reference numerals refer to similar elements and in which.

DETAILED DESCRIPTION OF THE INVENTION

Reference will now be made in detail to the embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be understood by one of ordinary skill in the art that the present invention may be practiced without these specific details. In other instances, well known methods, procedures, components, and circuits have not been described in detail as not to unnecessarily obscure aspects of the present invention.

Figure 1:
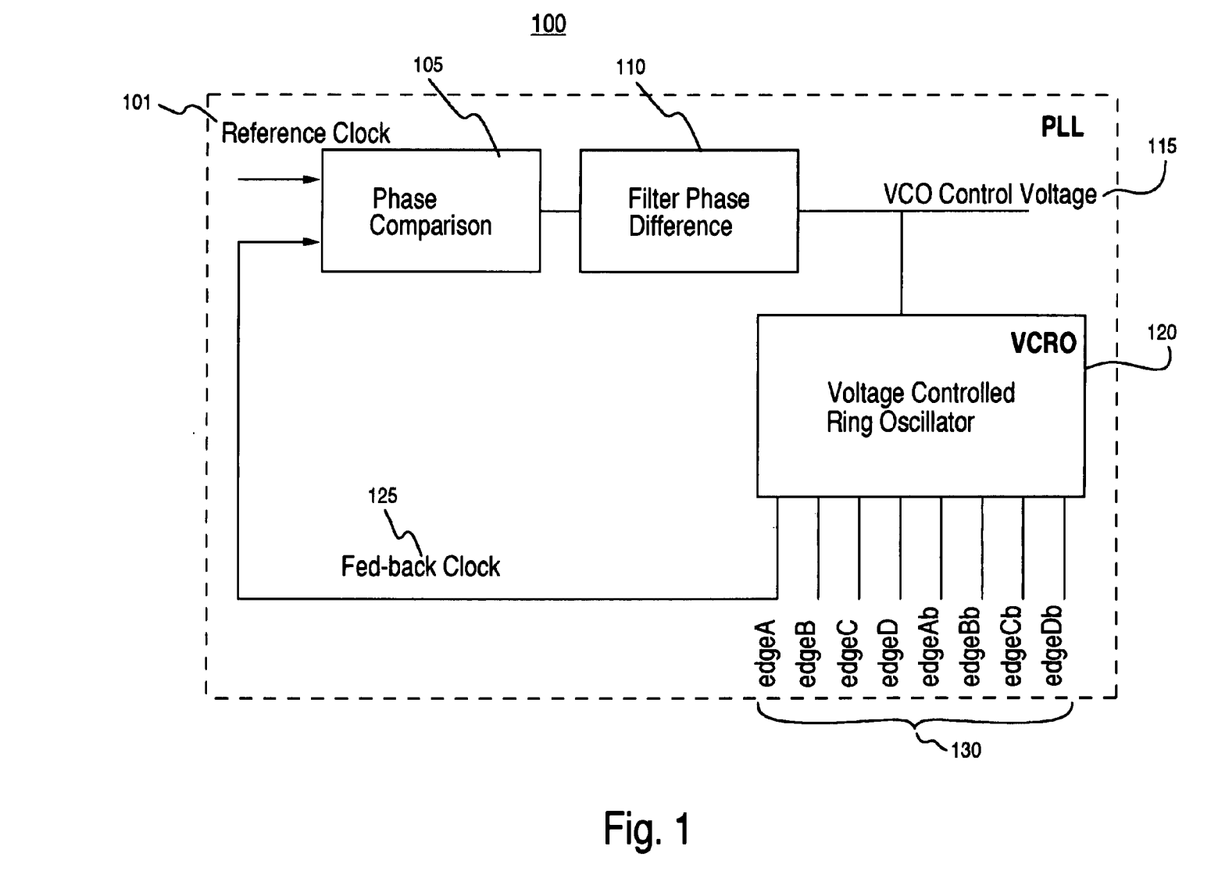
FIG. 1 shows a diagram of a PLL circuit in accordance with one embodiment of the present invention.

FIG. 1 shows a diagram of a PLL (phase locked loop) circuit 100 in accordance with one embodiment of the present invention. As depicted in FIG. 1, the PLL 100 includes a voltage controlled ring oscillator 120 coupled to receive a VCO control voltage 115 produced by a phase comparison unit 105 and phase difference unit 110.

The PLL 100 of the present embodiment is an exemplary PLL suitable for use with modern integrated circuit devices, such as, for example, highly integrated SOC (system-on-a- chip) devices. New SOCs are emerging with ADCs along with PLLs used for data formatting. The PLLs are usually comprised of a control loop (e.g., feedback clock 125) and a Voltage Controlled Oscillator (VCO). Internal VCOs are often realized as Voltage Controlled Ring Oscillators (VCROs), shown in PLL 100 as VCRO 120. VCRO 120 comprises rings of inverting stages that naturally oscillate and whose frequency can be changed by a control voltage, the VCO control voltage 115. The outputs 130 of the VCRO 120 are as shown.

The action of the PLL 100 can be used to lock the VCRO 120 frequency to an external clock (e.g., reference clock 101) frequency. VCROs often produce a nearly 50% Duty Cycle oscillation because the oscillation waveform must propagate twice through the Ring Oscillator before it returns to its initial state. The two propagations usually have same delay.

Figure 2:
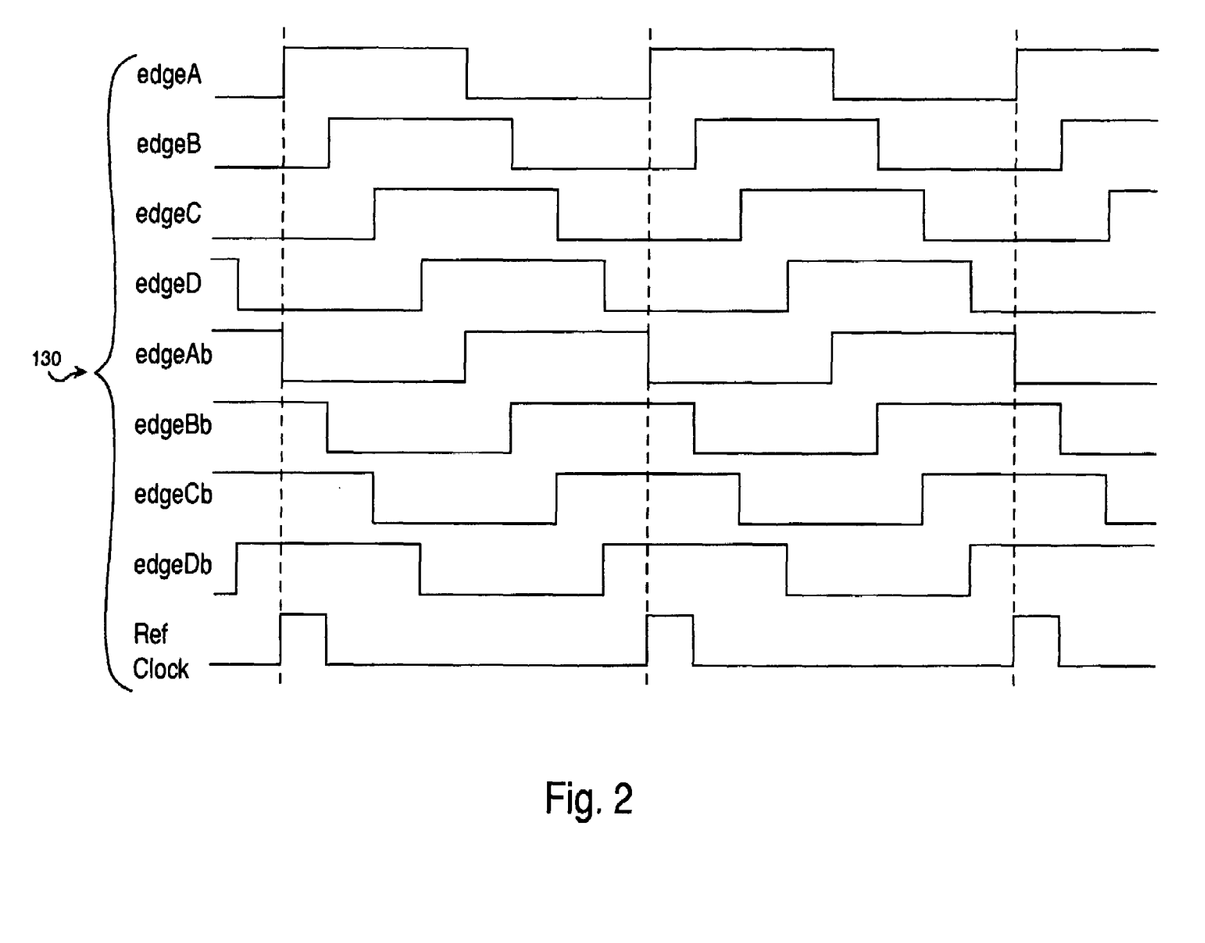
FIG. 2 shows a diagram depicting the outputs of the VCRO in accordance with one embodiment of the present invention.

FIG. 2 shows a diagram depicting the outputs 130 of the VCRO 120 in accordance with one embodiment of the present invention. As shown in FIG. 2, PLL 100 is a conventional PLL having typical phase noise/jitter performance. In the prior art, high performance VCROs incurred penalties with respect to increased power consumption. Additionally, in the prior art, PLLs configured for low power consumption usually produce higher jitter and therefore cannot be used as high performance ADC clocks. In contrast, the clock stabilization embodiments of the present invention enable the production of a high quality, low phase noise/jitter, 50% duty cycle internal clock signals, while using a conventional PLL, such as PLL 100, having typical phase noise/jitter.

Figure 3:
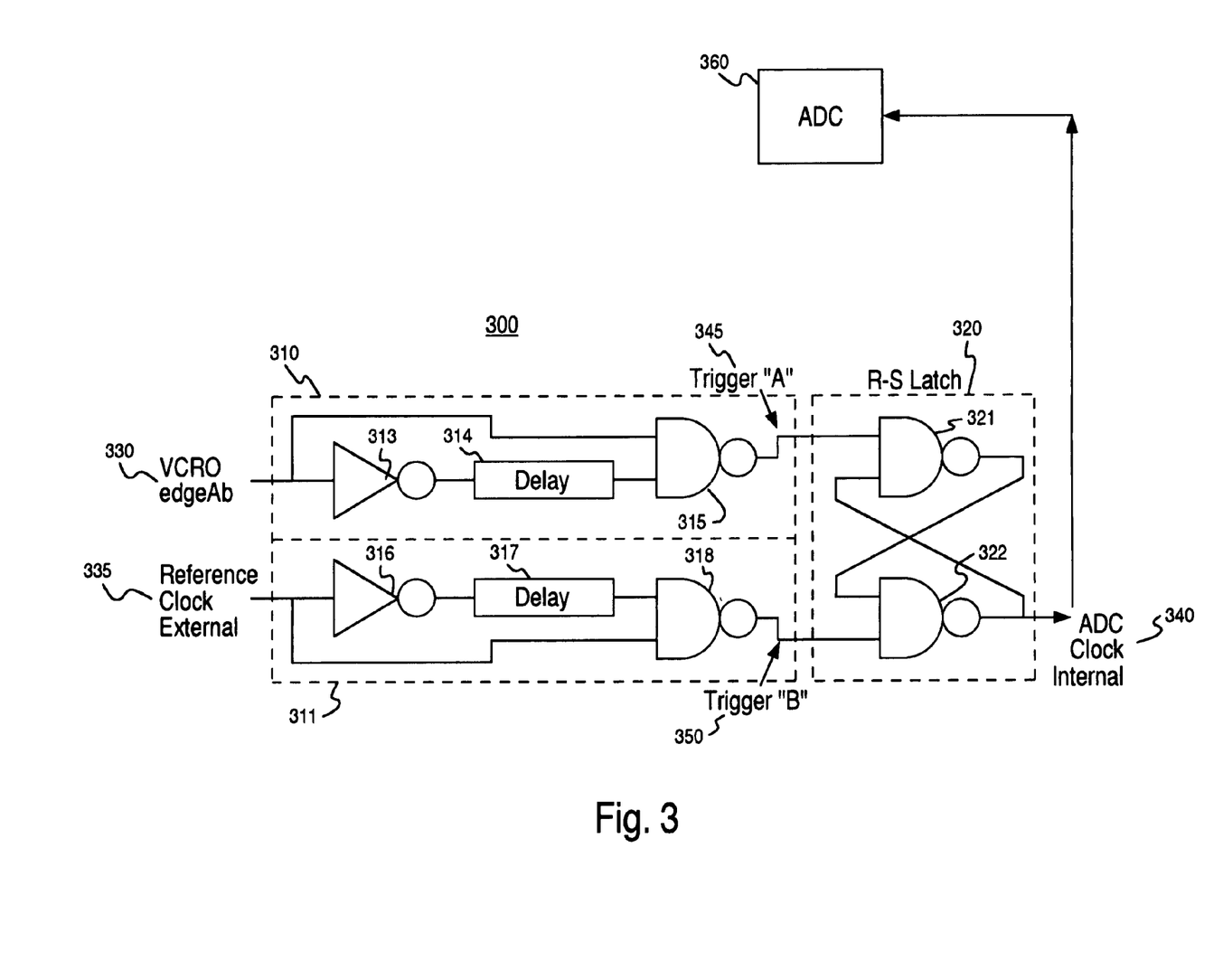
FIG. 3 shows a diagram depicting the internal components of a clock duty cycle stabilization circuit used to generate a high quality internal clock signal in accordance with one embodiment of the present invention.

FIG. 3 shows a diagram depicting the internal components of a clock duty cycle stabilization circuit 300 used to generate a high quality internal clock signal in accordance with one embodiment of the present invention. As shown in FIG. 3, the clock duty cycle stabilization circuit 300 (e.g., or simply the stabilization circuit 300) includes an edge detection circuit having a first and second portion 310–311, coupled to a latch circuit 320.

In the present embodiment, the stabilization circuit 300 functions in part by producing a high-quality internal clock signal, the ADC clock 340. The edge detection circuit 310–311 is configured to receive an external clock signal (e.g., a reference clock signal 335 produced by an external VCO) and generate an output therefrom. In the present embodiment, the output of the edge detection circuit 310–311 is the outputs 345–350 (e.g., Trigger A and Trigger B) as shown. The outputs 345–350 are coupled to the latch circuit 320. The latch circuit 320 is coupled to receive the outputs 345–350 and to produce a rising edge of the internal clock signal 340 and a falling edge of the internal clock signal 340 in accordance therewith. The duty cycle of the internal clock signal 340 is very stable and is substantially independent of duty cycle variations of the external reference clock signal 335.

In one embodiment, the edge detection circuit comprises a NAND gate coupled to a delay element, wherein the NAND gate has an input to receive the external clock signal and an output for producing the output of the edge detection circuit. In one embodiment, the latch circuit 320 comprises an R-S latch, wherein the R-S latch is configured to receive the output of the edge detection circuit and generate the rising edge and the falling edge therefrom. Additionally, in one embodiment, the internal clock signal 340 is a 50% duty cycle clock signal for use by an ADC 360.

In the present embodiment, each of the portions 310–311 of the edge detection circuit comprises a respective NAND gate coupled to a delay element. The NAND gate 318 of the portion 311 has an input to receive the external clock signal 335 and an output for producing the output 350 of the edge detection circuit. The NAND gate 315 of the portion 310 has an input to receive a conditioned signal 330 (e.g., VCRO edge Ab) and an output for producing the output 345 of the edge detection circuit.

The conditioned signal 330 is produced in accordance with the reference clock signal 335. The conditioned signal is a one half period delayed signal (with respect to the external clock signal 335) used to produce the falling edge of the internal clock signal 340. The conditioned signal is produced by the conditioning circuit. It should be noted that there are a number of different types of circuits that can be used to produce the conditioned signal, such as, for example, an RC delay circuit, an inverter delay circuit, and the like.

The conditioned signal 330 is used by the edge detection circuit portion 310 as shown. The external reference clock signal 335 is a reference clock signal from an external source, such as, for example, an external VCO, a crystal oscillator, a high quality sine source, or the like. The conditioned signal 330 passes through an inverter 313 and a delay element 314 and to the NAND gate 315. The external reference clock signal 335 passes through an inverter 316 and a delay element 317 and to the NAND gate 318.

In the present embodiment, the latch circuit 320 comprises an R-latch. The R-S latch 320 is configured to receive the output 345–350 of the edge detection circuit and generate the rising edge and the falling edge of the internal clock signal 340 therefrom. In the present embodiment, this internal clock signal 340 is a highly stable 50% duty cycle clock signal for use by an analog to digital converter 360.

Figure 4:
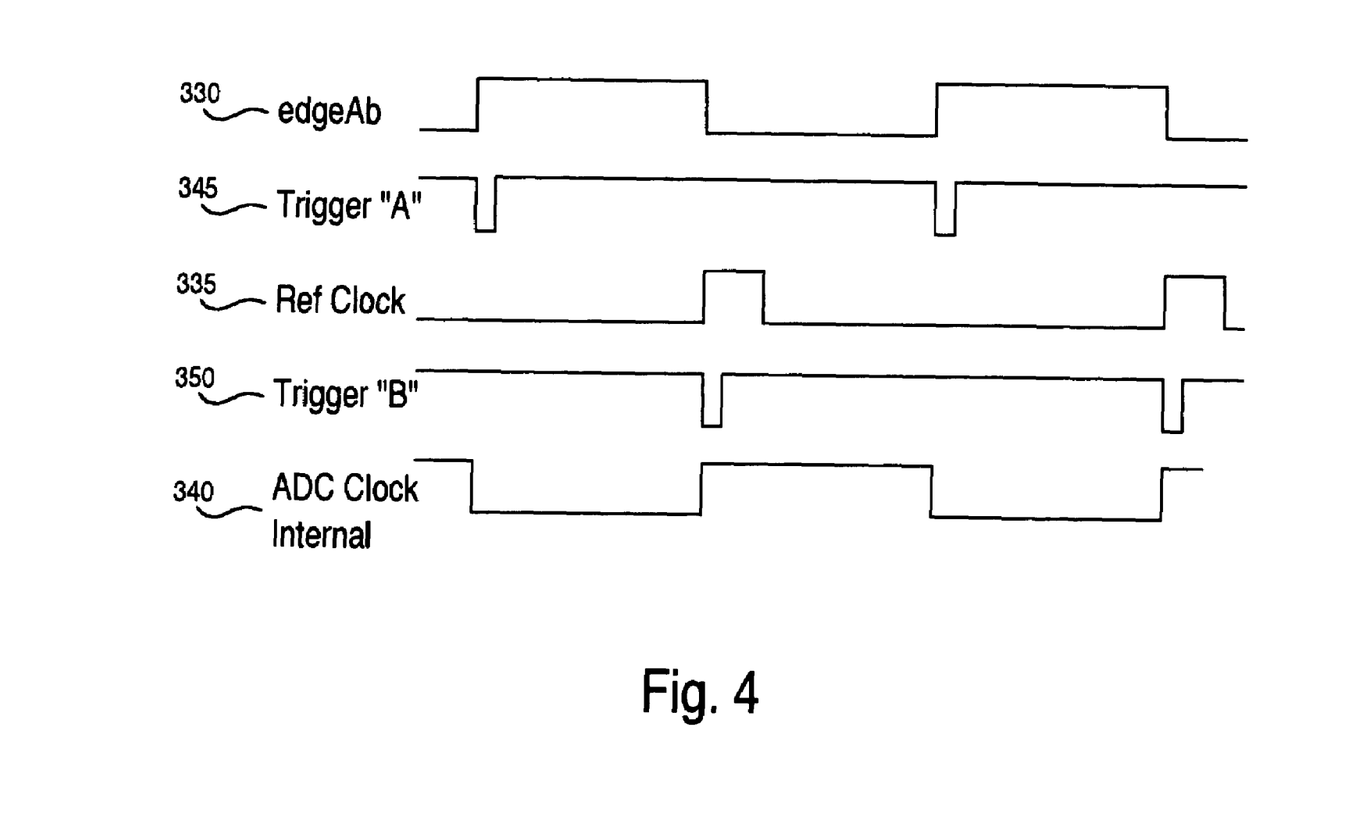
FIG. 4 shows a timing diagram depicting the signals from the stabilization circuit of FIG. 3 as shown.

FIG. 4 shows a timing diagram depicting the signals 330, 345, 335, 350, and 340 from the stabilization circuit 300 of FIG. 3 as shown. As depicted in FIGS. 3 and 4, the stabilization circuit 300 employs the edge detection circuitry 310–311 and the latch 320 to form the internal clock signal 340. During the operation of the edge detection circuit 310–311, a signal is applied to the input of the NAND and through the delay to the input of the NAND. The resulting output (e.g., signals 345 and 350) is a negative glitch following a rising edge of the input signal. This glitch is used to Set or Reset the state of the latch 320 (e.g., an R-S latch). The rising edge of the external reference clock signal 335 causes the R-S latch 320 to transition from Reset to Set or "O" to "1", thereby creating a rising output. The edge of the conditioned signal 330 (e.g., VCRO edge Ab) causes the R-S latch 320 to transition from Set to Reset or "I" to "o", thereby creating a falling output. The R-S latch 320 output is fed to clock timing circuits making sure the output rising edge is associated with the ADC 360 input sampling edge.

Thus, a low jitter 50% duty cycle clock 340 can be produced by using information from both the external low jitter clock 335 and the internal higher jitter VCRO 330. Sampling noise is introduced to an ADC 360 by the jitter on the clock edge associated with sampling the input signal. In ADC systems which sample the input signal only once per clock cycle, only the sampling edge of the clock must exhibit low jitter behavior. The opposite edge is non critical and can contain more jitter. The internal 50% duty cycle clock can be produced then by using the external clock 335 to generate the sampling edge and the internal VCRO 330 to generate the non-critical edge.

It should be noted that PLLs often lock their reference input clock edge to one VCRO stage output edge "edgeA". Seeing as these two edges are aligned, the inverse edge of stage A "edgeAb" 330 occurs exactly one half clock cycle after the reference edge 335. In the present embodiment, the internal clock 340 is generated by triggering a sample edge transition off the reference clock edge 335 and a non critical edge off edgeAb 330.

Figure 5:
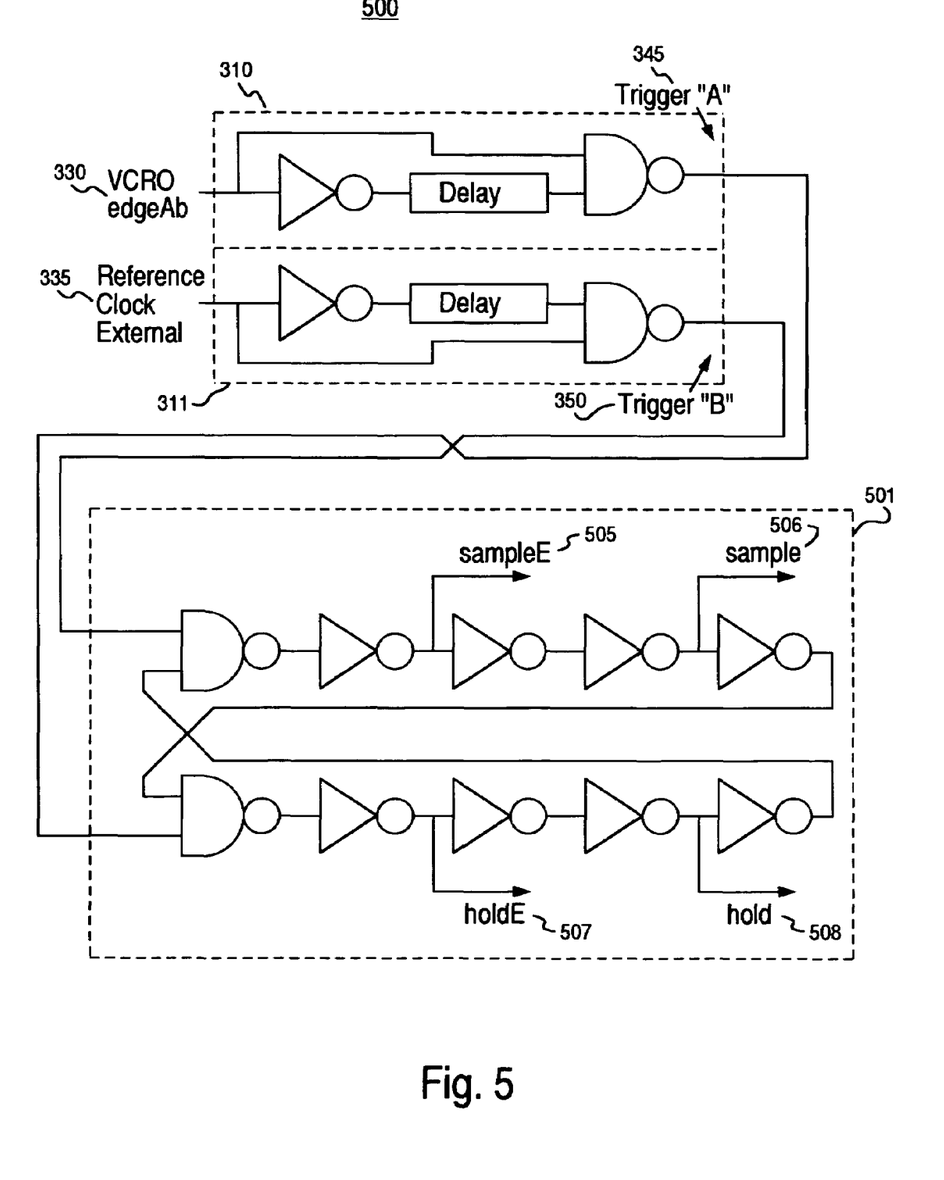
FIG. 5 shows a diagram depicting the internal components of a clock duty cycle stabilization circuit used to generate a high quality internal clock signal in accordance with an alternative embodiment of the present invention.

FIG. 5 shows a diagram depicting the internal components of a clock duty cycle stabilization circuit 500 used to generate a high quality internal clock signal in accordance with an alternative embodiment of the present invention. The circuit 300 embodiment generates a stand alone internal 50% duty cycle clock 340 which is then distributed to the ADC 360 clock timing generator. The circuit 500 embodiment distributes the reference clock edge and "edgeAb" to each timing generator and the 50% duty cycle is formed there.

Figure 6:
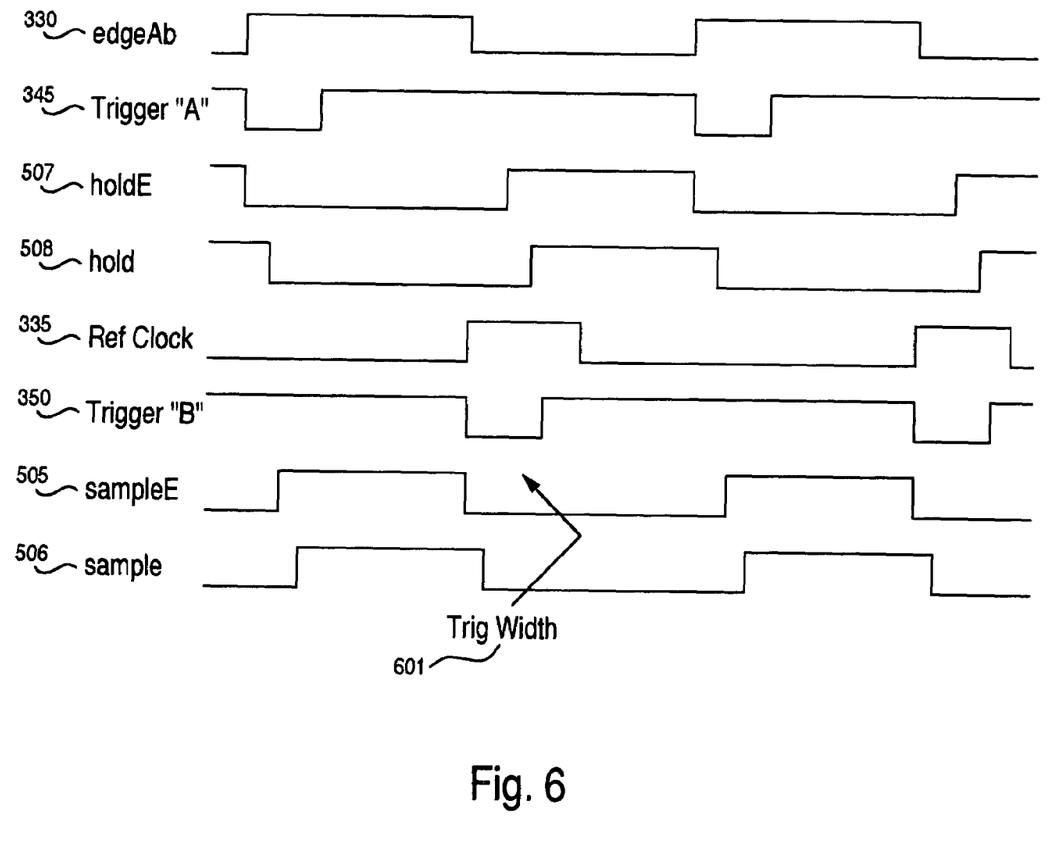
FIG. 6 shows the signal timing diagram for the stabilization circuit of FIG. 5.

The circuit 500 embodiment is much like the circuit 300 embodiment, yet it differs in the ADC timing. The associated signal timing diagram of stabilization circuit 500 is shown in FIG. 6. Switched-Capacitor ADCs usually have a non-overlapping clock timing generators which can be constructed as R-S latches with longer feedback delays. In the circuit 500 embodiment, the reference clock rising edge detection circuit portion 311 is used to set a non-overlapping clock generator 501. This setting is associated with the sampling edge of the ADC 360. The VCRO edge detection circuit portion 310 is used to reset the non-overlapping clock generator 501. This resetting is associated with the non-critical timing edges. For proper operation, the delay in the edge detection circuitry 310–311 needs to be greater than or equal in delay to a feedback path of the non-overlapping clock generator 501. The clock generator 501 produces the sample signals 505 and 506, and the hold signals 507 and 508 as shown.

FIG. 6 shows the signal timing diagram for the stabilization circuit 500 of FIG. 5. As depicted in FIG. 6, the timing of the signals 330, 345, 507, 508, 335, 350, 505, and 506 are shown. The trigger width arrow 601 points out the delay required for proper operation, where the delay in the edge detection circuitry 310–311 needs to be greater than or equal in delay to a feedback path of the non-overlapping clock generator 501. Thus, by using either the circuit 300 embodiment or the circuit 500 embodiment, a high performance 50% duty cycle clock can be created internally regardless of the external clock duty cycle. The 50% duty cycle leads to reduced design constraints and lower power operation for the ADC.

The foregoing descriptions of specific embodiments of the present invention have been presented for purposes of illustration and description. They are not intended to be exhaustive or to limit the invention to the precise forms disclosed, and many modifications and variations are possible in light of the above teaching. The embodiments were chosen and described in order best to explain the principles of the invention and its practical application, thereby to enable others skilled in the art best to utilize the invention and various embodiments with various modifications as are suited to the particular use contemplated. It is intended that the scope of the invention be defined by the claims appended hereto and their equivalents.

What is claimed is:

1. A clock signal duty cycle stabilization circuit, comprising:
    an edge detection circuit having a first delay and configured to receive an external clock signal and generate an output therefrom;
    a non-overlapping clock generator comprising a feedback path having a second delay, the non-overlapping clock generator coupled to receive a first signal comprising the output from the edge detection circuit and a second signal comprising an output from a conditioning circuit, the non-overlapping clock generator configured to produce an internal clock signal having a rising edge generated with the first signal and a falling edge generated with the second signal wherein the internal clock signal has a duty cycle that is independent of the duty cycle of the external clock, the non-overlapping clock generator further configured to produce a first sample signal, a second sample signal, a first hold signal, and a second hold signal;
    wherein the first delay is equal to or greater than the second delay.

2. The clock signal duty cycle stabilization circuit of claim 1, wherein the edge detection circuit comprises a NAND gate coupled to a delay element, the NAND gate having an input to receive the external clock signal and an output for producing the output of the edge detection circuit.

3. The clock signal duty cycle stabilization circuit of claim 1, wherein the non-overlapping clock generator comprises a delayed latch, the delayed latch configured to receive the output of the edge detection circuit and generate the rising edge and the falling edge therefrom.

4. The clock signal duty cycle stabilization circuit of claim 1, wherein the external clock signal is a reference clock signal from an external source.

5. The clock signal duty cycle stabilization circuit of claim 1, wherein the internal clock signal is a 50% duty cycle clock signal for use by an analog to digital converter.

6. An analog to digital converter system, comprising:
    an switched-capacitor analog to digital converter circuit for converting analog signals into digital signals;
    a clock signal duty cycle stabilization circuit coupled to the analog to digital converter circuit, the clock signal duty cycle stabilization circuit configured to produce an internal clock signal for use by the analog to digital converter circuit wherein the internal clock signal has a duty cycle that is independent of the duty cycle of the external clock, the clock signal duty cycle stabilization circuit further comprising:
        an edge detection circuit having a first delay and configured to receive the external clock signal and generate an output therefrom;
        a conditioning circuit for producing a conditioned signal having a one half clock period delayed phase with respect to the external clock signal and for use by the edge detection circuit; and
        a non-overlapping clock generator comprising a feedback path having a second delay, the non-overlapping clock generator coupled to receive a first signal comprising the output from the edge detection circuit and to receive a second signal comprising the conditioned signal, the non-overlapping clock generator configured to produce a rising edge of the internal clock signal and a falling edge of the internal clock signal in accordance with the second signal, the non-overlapping clock generator further configured to produce a first sample signal, a second sample signal, a first hold signal, and a second hold signal;
        wherein the first delay is equal to or greater than the second delay.

7. The system of claim 6, wherein the edge detection circuit comprises a NAND gate coupled to a delay element, the NAND gate having an input to receive the external clock signal and an output for producing the output of the edge detection circuit.

8. The system of claim 6, wherein the non-overlapping clock generator comprises a delayed latch, the delayed latch configured to receive the output of the edge detection circuit and generate the rising edge and the falling edge therefrom.

9. The system of claim 6, wherein the external clock signal is a reference clock signal from an external source.

10. The system of claim 6, wherein the internal clock signal is a 50% internal clock signal for use by an analog to digital converter.

11. A clock signal duty cycle stabilization circuit, comprising:
an edge detection circuit having a first delay and configured to receive an external clock signal and generate an output therefrom;
a VCRO circuit for producing a VCRO signal having one half clock period delayed phase with respect to the external clock signal and for use by the edge detection circuit; and
a non-overlapping clock generator comprising a feedback path having a second delay, the non-overlapping clock generator coupled to receive the output from the edge detection circuit, the non-overlapping clock generator configured to produce an internal clock signal in accordance with a setting and resetting of the non-overlapping clock generator in accordance with a first signal and a second signal, the first signal comprising the output of the edge detection circuit and the second signal comprising the VCRO signal, wherein the rising edge of the external clock sets non-overlapping clock generator to produce a rising edge of the internal clock signal and the VCRO signal resets the non-overlapping clock generator to produce a falling edge of the internal clock signal wherein the internal clock signal has a duty cycle that is independent of the duty cycle of the external clock, the non-overlapping clock generator further configured to produce a first sample signal, a second sample signal, a first hold signal, and a second hold signal;
wherein the first delay is equal to or greater than the second delay.

12. The clock signal duty cycle stabilization circuit of claim 11, wherein the edge detection circuit comprises a NAND gate coupled to a delay element, the NAND gate having an input to receive the external clock signal and an output for producing the output of the edge detection circuit.

13. The clock signal duty cycle stabilization circuit of claim 11, wherein the non overlapping clock generator comprises a delayed latch, the delayed latch configured to receive the output of the edge detection circuit and generate a rising edge of the internal clock signal therefrom.

14. The clock signal duty cycle stabilization circuit of claim 11, wherein the external clock signal is a reference clock signal from an external source.

15. The clock signal duty cycle stabilization circuit of claim 11, wherein the internal clock signal is for use by an analog to digital converter coupled to the clock signal duty cycle stabilization circuit.

16. An analog to digital converter system, comprising:
an analog to digital converter circuit for converting analog signals into digital signals;
a clock signal duty cycle stabilization circuit coupled to the analog to digital converter circuit, the clock signal duty cycle stabilization circuit configured to produce an internal clock signal for use by the analog to digital converter circuit, the clock signal duty cycle stabilization circuit further comprising:
an edge detection circuit having a first delay and configured to receive an external clock signal and generate an output therefrom; and
a VCRO circuit for producing a VCRO signal having one half clock period delayed phase with respect to the external clock signal and for use by the edge detection circuit; and
a non-overlapping clock generator comprising a feedback path having a second delay, the non-overlapping clock generator coupled to receive the output from the edge detection circuit, the non-overlapping clock generator configured to produce an internal clock signal in accordance with a setting and resetting of the timing generator circuit in accordance with a first signal and a second signal, the first signal comprising the output of the edge detection circuit and the second signal comprising the VCRO signal, wherein the rising edge of the external clock sets the non-overlapping clock generator to produce a rising edge of the internal clock signal and the VCRO signal resets the non-overlapping clock generator to produce a falling edge of the internal clock signal wherein said internal clock signal has a duty cycle that is independent of the duty cycle of said external clock, the non-overlapping clock generator further configured to produce a first sample signal, a second sample signal, a first hold signal, and a second hold signal;
wherein the first delay is equal to or greater than the second delay.

17. The system of claim 16, wherein the edge detection circuit comprises a NAND gate coupled to a delay element, the NAND gate having an input to receive the external clock signal and an output for producing the output of the edge detection circuit.

18. The system of claim 16, wherein the non overlapping clock generator comprises a delayed latch, the delayed latch configured to receive the output of the edge detection circuit and generate a rising edge of the internal clock signal therefrom.

19. The system of claim 16, wherein the external clock signal is a reference clock signal from an external source.

* * * * *